(12) United States Patent
Cash et al.

(10) Patent No.: US 6,172,509 B1
(45) Date of Patent: Jan. 9, 2001

(54) DETECTING POLYPHASE MACHINE FAULTS VIA CURRENT DEVIATION

(75) Inventors: Marcus A. Cash, St. Destin, FL (US); Thomas G. Habetler, Snellville, GA (US)

(73) Assignee: The United States of America as represented by the Secretary of the Air Force, Washington, DC (US)

(*) Notice: Under 35 U.S.C. 154(b), the term of this patent shall be extended for 0 days.

(21) Appl. No.: 09/248,731

(22) Filed: Feb. 11, 1999

(51) Int. Cl.$^7$ .................. G01R 31/06; H02K 17/32; G06F 15/00
(52) U.S. Cl. .................. 324/546; 318/434; 702/185
(58) Field of Search .................. 324/546, 772, 324/57, 58, 59, 64, 65; 702/182, 185; 318/434

(56) References Cited

U.S. PATENT DOCUMENTS

| | | |
|---|---|---|
| 4,858,057 | 8/1989 | Maier et al. . |
| 4,965,513 | 10/1990 | Haynes et al. . |
| 4,978,909 | 12/1990 | Hendrix et al. . |
| 5,252,915 | 10/1993 | Sedding et al. . |
| 5,433,245 | 7/1995 | Prather et al. . |
| 5,477,162 * | 12/1995 | Heikkila .................. 324/772 |
| 5,477,163 | 12/1995 | Kliman . |
| 5,514,978 * | 5/1996 | Koegl et al. .................. 324/772 |
| 5,523,701 | 6/1996 | Smith et al. . |
| 5,566,092 | 10/1996 | Wang et al. . |
| 5,602,761 | 2/1997 | Spoerre et al. . |
| 5,680,025 | 10/1997 | Bowers, III et al. . |
| 5,739,698 | 4/1998 | Bowers et al. . |
| 6,006,170 * | 12/1999 | Marcantonio et al. .................. 702/182 |

OTHER PUBLICATIONS

G.B. Kliman, W.J. Premerlani, R.A. Koegl, D. Hoeweler, "A New Approach to On–Line Turn Fault Detection in AC Motors," Conference Record of the *IEEE–IAS Annual Meeting*, 1996, pp. 687–693.

J. Sottile, Jr, J.L. Kohler, "An On–Line Method to Detect Incipient Failure of Turn Insulation in Random–Wound Motors," *IEEE Transactions on Energy Conversion*, vol. 8, No. 4, Dec. 1993, pp. 762–768.

R. Maier, "Protection of Squirrel–Cage Induction Motor Utilizing Instantaneous Power and Phase Information," *IEEE Transactions on Industry Applications*, vol. 28, No. 2, Mar./Apr. 1992. pp. 376–380.

M.A. Cash, T.G. Habetler, G.B. Kliman, "Insulation Failure Prediction in Induction Machines Using Line–Neutral Voltages," Conference Record of the Annual *IEEE–IAS Meeting*, Oct. 1997, pp. 208–212.

(List continued on next page.)

\* cited by examiner

Primary Examiner—Safet Metjahic
Assistant Examiner—Anjan K. Deb
(74) Attorney, Agent, or Firm—Gerald B. Hollins; Thomas L. Kundert

(57) ABSTRACT

An electrical winding fault detection system wherein turn-to-turn and other winding faults in a polyphase alternating current machine are identified through processing of measured machine winding current flow changes, i.e., through identification of changes in electrical balance conditions in the machine. This disclosed processing includes scaling or normalization of measured operating currents using current measurements made while the machine is known to be in fault-free normal operating condition and altering the normalization by a relationship between average current flow in the fault-free condition and average current flow in the monitored changing load condition. Machine operation from a balanced energization source is preferred for successful use of the system; it is therefore especially suited to multiple phased machines operated from electronically derived alternating current energy. The invention is disclosed primarily in terms of a motor-operated machine; however, application to generator (i.e., alternator), machines and transformers having balanced loads is also contemplated.

25 Claims, 8 Drawing Sheets

OTHER PUBLICATIONS

M.A. Cash, T.G. Habetler, "Insulation Failure Prediction in Inverter–Fed Induction Machines Using Line–Neutral Voltages," *Conference Record of the Applied Power Electronics Meeting (APEC)*, Feb. 1998, in print.

W.T. Shugg, *Handbook of Electrical and Electronic Insulating Materials,IEEE Press*, 1995.

A.H. Bonnett, G.C. Soukup, "Cause and Analysis of Stator and Rotor Failures in Three–Phase Squirrel–Cage Induction Motors," *IEEE Transactions on Industry Applications*, vol. 28, No. 4, Jul./Aug. 1992 , pp. 921–937.

R.H. Rehder, R.E. Draper, B.J. Moore "How Good is Your Motor Insulation System?" *IEEE Electrical Insulation Magazine*, vol. 12, No. 4, Jul./Aug. 1996, pp. 8–14.

A.H. Bonnett, "Available Insulation Systems for PWM Inverter–Fed Motors," *IEEE Industry Applications Magazine*, vol. 4, No. 1, Jan./Feb. 1998, pp. 14–26.

L. Manz, "Applying Adjustable–Speed Drives to Three–Phase Induction NEMA Frame Motors," *IEEE Transactions On Industry Applications*, vol, 33, No. 2, Mar./Apr. 1997, pp. 402–407.

DETECTING POLYPHASE MACHINE FAULTS VIA CURRENT DEVIATION

RIGHTS OF THE GOVERNMENT

The invention described herein may be manufactured and used by or for the Government of the United States for all governmental purposes without the payment of any royalty.

BACKGROUND OF THE INVENTION

Incipient electrical insulation failure in a polyphase alternating current electrical machine produces a slight change in the electrical behavior of the machine. For example, at the earliest stage of insulation failure on higher-voltage machines, insulation breakdown produces small, added-energy dissipations within the machine stator structure. These dissipations are detectable but usually escape notice without the aid of sophisticated monitoring equipment at the machine's electrical terminals (e.g., equipment as disclosed herein) or elsewhere. Furthermore, the occurrence of early stage faults of this nature accelerates the insulation degradation process through causing increased machine losses and the production of higher insulation temperatures. It is therefore desirable to detect such faults before maturity into a more significant fault occurs. In this regard, it is known for example that insulation life in a machine decreases by fifty percent for every ten degree centigrade rise in machine temperature under some conditions. The detection of such faults in large polyphase machines which are embedded into capital equipment systems, motors such as are used in a steel rolling mill, the motors used in mining equipment or motors used for ship propulsion, is especially desirable in view of the cost of such equipment and the significant economic impact occurring with a surprise equipment failure.

An ultimate consequence of such evolving machine insulation failures is the occurrence of a "bolted" or low-impedance turn short. At this advanced stage of failure, several prior art fault-detection approaches possess the capability to reliably detect an anomaly. A turn short creates a consistent change in the electrical behavior of the machine across the entire spectrum of its operation, including alteration of one or more of the machine phase impedances at the fundamental frequency of its energy source. To detect a bolted turn short in a wye-connected machine, for example, one need only examine each machine phase with respect to each other phase in terms of deviations in the line-neutral voltage. A system of this type has been disclosed by M. A. Cash, T. G. Habetler, G. B. Kliman, in "Insulation Failure Prediction in Induction Machines Using Line-Neutral Voltages," *Conference Record of the Annual IEEE-IAS Meeting*, Oct. 1997, pp. 208–212. A bolted turn short may also be detected through impedance changes as has been described by R. Maier, in "Protection of Squirrel-Cage Induction Motor Utilizing Instantaneous Power and Phase Information," *IEEE Transactions on Industry Applications*, vol. 28, no. 2, March/April 1992, pp. 376–380.

Turn fault detection based on both machine current and voltage change has also been accomplished in the art as is disclosed by G. B. Kliman, W. J. Premerlani, R. A. Koegl, D. Hoeweler, in "A New Approach to On-Line Turn Fault Detection in AC Motors," *Conference Record of the IEEE-IAS Annual Meeting*, 1996, pp. 687–693, and also by J. Sottile, Jr., J. L. Kohler, in "An On-Line Method to Detect Incipient Failure of Turn Insulation in Random-Wound Motors," *IEEE Transactions on Energy Conversion*, vol. 8, no. 4, December 1993, pp. 762–768. That the combination of current and voltage change may be used for detection of bolted turn shorts in a machine has also been disclosed in the same Kliman et al., vol. 8, no. 4, December 1993, pp. 762–768 publication. Detection success depends, of course, on the severity of fault in each of these instances. Generally speaking most prior art fault detection arrangements depend on both voltage and current change detection. Each of these two papers discloses a somewhat-complex sequence component based detection arrangement, an arrangement requiring considerable signal processing capability.

A turn fault in one phase of a polyphase electrical machine changes the electrical impedance of each machine phase as a result of electrical and magnetic coupling within the machine. The effect of a fault in one phase differs between the machine phases, however; this reveals not only fault presence, but also provides information as to fault severity and locale. To actually monitor phase impedance is nevertheless a considerable task, a process often requiring digital signal processing. The effects of a turn fault are found however to be more readily observed. In many circumstances, it in fact suffices for fault detection to observe either machine phase currents or phase voltages; thus, observation of both currents and voltages is not necessary.

For example, in our U.S. Pat. No. 6,043,664 "Method and Apparatus for Turn Fault Detection in Multi-Phase AC Motors" filed in the names of Gerald Burt Kliman, Thomas Gerard Habetler and Marcus Alex Cash (herein the Kliman et al. application) filed in October 1997 by General Electric Company, Schenectady, N.Y., there is disclosed a phase-voltage-based fault detection system. This application, which is hereby incorporated by reference herein, claims the benefit of a United States provisional application, Ser. No. 60/048,904, filed Jun. 6, 1997 and employs a fault detection algorithm based on line to neutral voltage sensing in a polyphase electrical machine.

Reliable monitoring of the phase currents for turn fault detection depends upon consistency of balance in the source of machine excitation in the case of a motor machine and consistency of balance in the machine load in the case of use with a generator machine. An electronic inverter energy source can provide this consistency-of-source-balance for a motor machine. Such an electronic inverter can also provide a source of variable electrical frequency energy and thus variable operating speed for the energized motor. Of course, monitored machine phase currents also depend upon mechanical load applied to the motor; however, each phase equally reflects this variable.

The only other source of change in balance in motor phase currents is internal to the machine and moreover does not depend on its wye or delta internal configuration. Given this preferred inverter excitation, a change in machine phase current balance is attributable to either a mechanical issue, such as rotor eccentricities, or an electrical fault, e.g., a fault of the type herein considered. In the present invention use of motor current changes, the effect of rotor eccentricities is suppressed by averaging. On average, for example, rotor eccentricity will affect each phase to the same degree in an asynchronous machine. In a synchronous machine system, calibration can eliminate the effect of rotor eccentricity.

The present invention therefore concerns early detection of electrical winding faults in multiple phased alternating current electrical machines, such as motor or generator, (i.e., alternator) machines, through use of line current sensing and electrical balance change detection.

SUMMARY OF THE INVENTION

The present invention provides a winding fault detection system, based on phase current change, for a polyphase electrical machine.

It is an object of the present invention therefore to provide current-based, continuous active monitoring of an operating electrical machine for winding failure events.

It is another object of the invention to provide a winding fault detection arrangement capable of generating predictive or anticipatory warnings of machine winding failure.

It is another object of the invention to provide a phase current based winding fault detection arrangement for a rotating electrical machine.

It is another object of the invention to provide an iterative or repeating cycle winding fault detection arrangement for a rotating electrical machine.

It is another object of the invention to provide a winding fault detection arrangement of desirable-sensitivity to fault occurrences.

It is another object of the invention to provide a fault onset, rate-responsive fault detection arrangement for an electrical machine.

It is another object of the invention to provide an electrical machine winding fault detection arrangement based on standard deviation, variance, divergence or other statistical measures of machine balance conditions.

It is another object of the invention to provide a winding fault detection arrangement in which both speed of fault onset and fault severity are detection considerations.

It is another object of the invention to provide a winding fault detection arrangement in which normal imbalances between phases of a polyphase machine are accommodated.

It is another object of the invention to provide a winding fault detection arrangement in which machine load changes are accommodated.

It is another object of the invention to provide a winding fault detection arrangement based on scaled, normalized or "per unit" signal measurements.

It is another object of the invention to provide a winding fault detection arrangement relevant to a machine operated from a balanced polyphase energy source.

It is another object of the invention to provide a winding fault detection arrangement especially relevant to a polyphase machine operated from an electronic inverter circuit.

It is another object of the invention to provide a winding fault detection arrangement in which current sensing in two conductors feeding two winding phases of a three-phase machine together with calculation of the third phase conductor current may be used.

It is another object of the invention to provide a winding fault detection arrangement usable in a variety of polyphase AC electrical machines, machines which include induction motors, induction generators, synchronous motors and synchronous generators.

It is another object of the invention to provide a winding fault detection arrangement that is also relevant to polyphase transformers.

It is another object of the invention to provide a winding fault detection arrangement responsive to turn-to-turn winding faults in addition to responding to turn-to-ground faults.

It is another object of the invention to provide a winding fault detection arrangement amenable to either of a software or hardware embodiment or to a combined software and hardware embodiment or to embodiment inclusive of as a neural network.

It is another object of the invention to provide a winding fault detection arrangement in which all or substantial portions of the involved signal processing and computations may be accomplished in real time.

It is another object of the invention to provide a winding fault detection arrangement in which the involved signal processing and computations may be accomplished according to a multiple equation mathematical algorithm.

Additional objects and features of the invention will be understood from the following description and claims and the accompanying drawings.

These and other objects of the invention are achieved by the winding fault detecting method of operating a phase current-monitored polyphase alternating current rotating machine comprising the steps of:

scaling monitored ongoing root-mean-square phase current values of said machine to both winding turn fault-free healthy operation values of said phase currents and to changes in a mathematical average of said monitored phase currents;

determining one of a statistical standard deviation and a statistical variance representations of summed differences between scaled phase current values and scaled mathematical average phase current values in said machine; and indicating a winding fault detection event in response to one of said statistical representations exceeding a selected magnitude.

DETAILED DESCRIPTION

Figure 1:
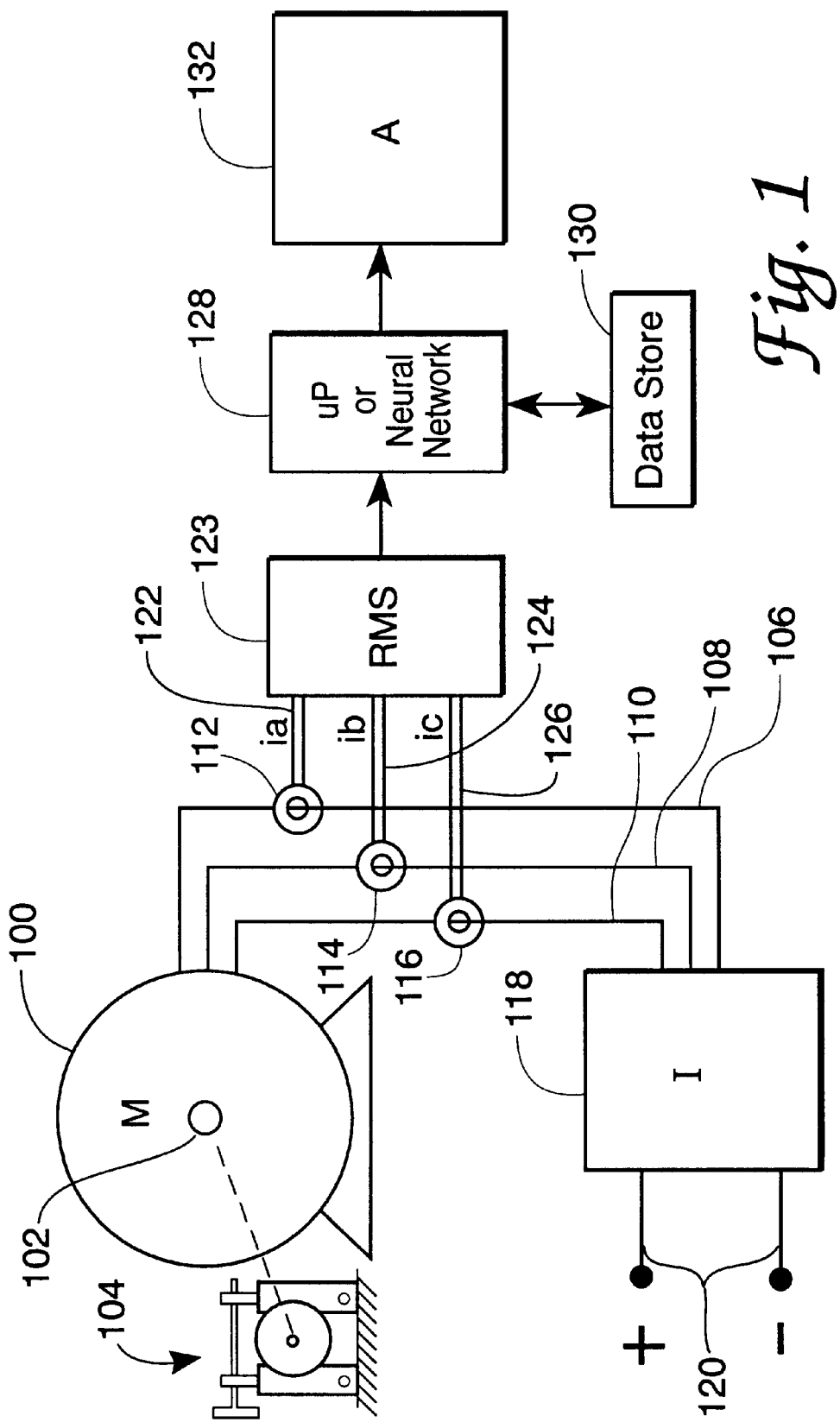
FIG. 1 shows an overall block diagram of a rotary machine including winding fault protection.

The decade of the 1990's delivered promising developments in the prevention and detection of insulation failure in electrical machines. As discussed by, for example, W. T. Shugg, in *Handbook of Electrical and Electronic Insulating*

*Materials*, IEEE Press, 1995, part of the credit for these improvements belongs to improved knowledge regarding insulation and its gradual deterioration. In addition, applied signal processing techniques have allowed continuous monitoring of electrical machines for signs of insulation breakdown. Lately, notwithstanding these improvements, the electronic inverter drive for motor machines has been accused of increasing the failure rate of winding insulation and is therefore one example of the need for continuing innovation in this art. The need for smaller machines of lower mass and greater reliability in cutting edge equipment such as military airborne systems is another and ongoing example of need for improvement in machine insulation.

In the present context, continued improvements with respect to machine insulation include aspects of both failure prevention and failure prediction. Preventive measures mitigate the probability of premature machine insulation failure, whereas predictive measures facilitate accomplishment of appropriate action when machine insulation failure is imminent or incipient. It is generally accepted, for example, that machine insulation failure begins with minor turn shorts that gradually progress in severity before adversely affecting machine operation. The present invention concerns a new technique to predict insulation failure by detecting these minor turn shorts before progression into total machine failure occurs.

The present invention therefore provides a current-based scheme for detecting stator turn faults arising from insulation failure in, for example, an adjustable speed drive-energized, three-phase induction motor. As disclosed in the paragraphs following, statistical analysis—applied to the root-mean-square magnitudes of the motor line currents—is found to be capable of detecting turn shorts with ease and conviently usable sensitivity. More explicitly, in the present invention, a continuous calculation of the standard deviation of the calibrated root-mean-square line currents of a machine exposes a change in the machine's electrical balance that is caused by turn shorts. To account for inherent machine imbalance, calibration is performed with the machine in a known fault-free state; additionally, current normalization accounts for varying loads. The herein disclosed system is, however, sensitive to source balance, and is thus primarily useful for machines coupled to a balanced energy source or a balanced load, machines such as an inverter-fed induction motor machine. Use of the herein disclosed system with other machines such as synchronous motors is also contemplated.

Considering now several mathematical relationships relevant to a three-phase motor arrangement of the invention, the instantaneous phase currents flowing to such a three-phase machine may be represented as $i_a$, $i_b$ and $i_c$, and the corresponding one cycle moving-root-mean-square currents in the machine represented by $I_a$, $I_b$ and $I_c$, At some time when the machine is known to be in a non-faulted state, three specific root-mean-square current values, $I^h_a$, $I^h_b$ and $I^h_c$, flow (and are stored, and referenced for later determining the relative balance of the machine). The letter "h" in these symbols is used to indicate a "healthy" state machine current. Then, $I_a$, $I_b$ and $I_c$ may be scaled according to $I^h_a$, $I^h_b$ and $I^h_c$ to normalize each phase current, at the selected instant of time, and under that particular load, to a per-unit value of 1.0. That is, $$\frac{I_a}{I^h_a} = \frac{I_b}{I^h_b} = \frac{I_c}{I^h_c} = 1.0. \quad (1)$$

An alternate interpretation of this equation (1) is that at the selected instant of determining $I^h_a$, the root-mean-square current $I_a$ has a value of $I^h_a$ and therefore $I_a/I^h_a$ has a magnitude of 1.0—and similarly for the other currents $I^h_b$ and $I^h_c$.

Balance will remain in the normalized or scaled currents of a machine until a turn fault occurs. Of course, a change in machine load increases the phase currents above the relative one per-unit value. This is compensated by scaling the monitored currents by the scaling factor ratios ($\alpha_a, \alpha_b, \alpha_c$) of the average of the currents at the reference condition, to the average of the currents in the present, monitored condition and incorporating that modification to the normalization of equation (1). The combination of these scaling factors for the three-phase currents yields three ratios, each having the form, $$\alpha_b = \frac{I^h_{ave}}{I^h_b \cdot I_{ave}}, \quad (2)$$

where $$I^h_{ave} = \frac{(I^h_a + I^h_b + I^h_c)}{3} \quad (3)$$

and $$I_{ave} = \frac{(I_a + I_b + I_c)}{3}. \quad (4)$$

Thus, the scaling factor for each root-mean-square phase current ultimately becomes of the form $$\alpha_a = \frac{(I^h_a + I^h_b + I^h_c)}{I^h_a \cdot (I_a + I_b + I_c)}. \quad (5)$$

Balance between the phases of a machine may be determined through use of the standard deviation function often used in statistical or probability theory. This mathematical function has the physical significance of determining totaled departure from an average current value of the phase currents. More precisely the standard deviation function represents the square root of the sum of the squared differences between each phase current and the average phase current when each current is represented as a per unit value; this is represented in equation (6) below. A related statistical function, the variance, may also be used for this measure. The variance function omits the square root operator in equation (6) and is simply the sum of the squared differences between each phase current and the average phase current when each current is represented as a per unit value, i.e., the variance is represented by the three terms under the radical in equation (6)

$$\sqrt{(\alpha_a \cdot I_a - 1.00)^2 + (\alpha_b \cdot I_b - 1.00)^2 + (\alpha_c \cdot I_c - 1.00)^2} \geq \delta. \quad (6)$$

For present purposes the standard deviation as computed on a repeating and continuing iterative basis for a monitored machine is compared with a threshold level of amplitude δ as indicated by the final term of equation (6) and a fault detected alarm sounded when the threshold value is exceeded. A similar threshold may be employed with the variance term when used. Actually in a broader sense, any mathematical measure of what can be readily observed in FIG. 8 and FIG. 13 of the drawings herein is of potential utility in performing this computation. Notably, scaling the presently discussed root-mean-square currents by the averages in equations (3) and (4) allows a simpler choice of threshold magnitude δ—one that does not depend upon machine load.

The convenient mathematical calculation in equation (6) has proven successful in simulated insulation failure experiments of the type disclosed below herein—experiments where an intentional turn fault is introduced to an adjustable speed drive-energized induction machine. As indicated elsewhere herein, since changes in the balance of the phase currents do respond to balance conditions in the machine energy source, this process is somewhat less useful for mains-connected machines because nearby single-phase loads may cause false winding fault alarms, for example.

FIG. 1 in the drawings shows an overall block diagram of a rotary machine of the motor type disposed in an operating environment inclusive of winding fault detection according to the present invention. In the FIG. 1 drawing, a motor 100 of the three-phase induction type, having an output shaft 102, is shown energized by an electronic inverter 118, an inverter of the adjustable speed drive type. The motor 100 and inverter 118 typically receive energy from a direct current energy source via an input path 120. Instantaneous currents flowing to the windings of the motor 100 through the motor leads 106, 108 and 110 in FIG. 1 are sensed or measured by the current transformers (or other means) 112, 114 and 116 and generate signals $i_a$, $i_b$, and $i_c$ communicated to input ports of a one cycle root-mean-square signal generator circuit 123 by way of the two conductor energy paths represented at 122, 124 and 126.

The root-mean-square signal generator 123 determines a moving, one-cycle-interval representation of instantaneous current measurements for each of the motor leads 106, 108 and 110, and provides signals indicative of these currents to the microprocessor 128 (or to a neural network if used). The one cycle root-mean-square signal generator 123 may comprise a single time-shared electrical circuit which is, for example, controlled from the microprocessor 128 to perform the processing of signals from the three paths represented at 122, 124 and 126 in a serial sequence or alternately be comprised of three individual processing circuits or, as discussed below, represent a software embodied algorithm.

The FIG. 1 microprocessor 128 is also connected to a data storage element 130 and to an alarm element 132. The data storage element 132 may be in a separate integral form as shown in FIG. 1 or alternately embodied as the customary mixture of read only, random access and disc memory included within the microprocessor 128. The alarm 132 may be of any known variety such as a visible, audible, written record, motor energy interruption device or other types including a radiated signal device. The FIG. 1 motor machine 102 is connected to some mechanical load— possibly a load requiring variable speed motor rotation as is enabled by the electronic inverter source of motor energy at 118; this load is represented symbolically by the motor shaft 102-connected proney brake apparatus at 104. The current transformers 112, 114 and 116 in FIG. 1 may be replaced with Hall effect sensors or other electrical current-responsive elements including, for example, electrical resistance elements connected to a differential amplifier input stage in the root-mean-square signal generator 123. Such electrical resistance elements may actually be comprised of the conductor resistance of motor leads 106, 108 and 110 when a differential input amplifier with adequate gain and common mode signal rejection is included in the root-mean-square signal generator 123.

The FIG. 1 apparatus represents a preferred combination of elements capable of performing the computations described in equations 1–6 above. Other element combinations to accomplish these computations are of course feasible and may be preferable in some uses of the invention. These combinations may, for example, avoid the mixture of hardware and software employed in the FIG. 1 embodiment and use either an entirely hardware or entirely software processing of the signals on paths 122, 124 and 126. An entirely software embodiment of the FIG. 1 system can, for example, couple the signals on paths 122, 124 and 126 directly to the microprocessor 128 and possibly also retain a generated alarm signal within the microprocessor 123. Since computation of one cycle moving root-mean-square signals from the instantaneous current signals on paths 122, 124 and 126 is easily performed in a hardware electronic apparatus, the mixture of hardware and software represented in FIG. 1 or some other mixture of hardware and software is believed preferable for embodying the invention.

Figure 4:
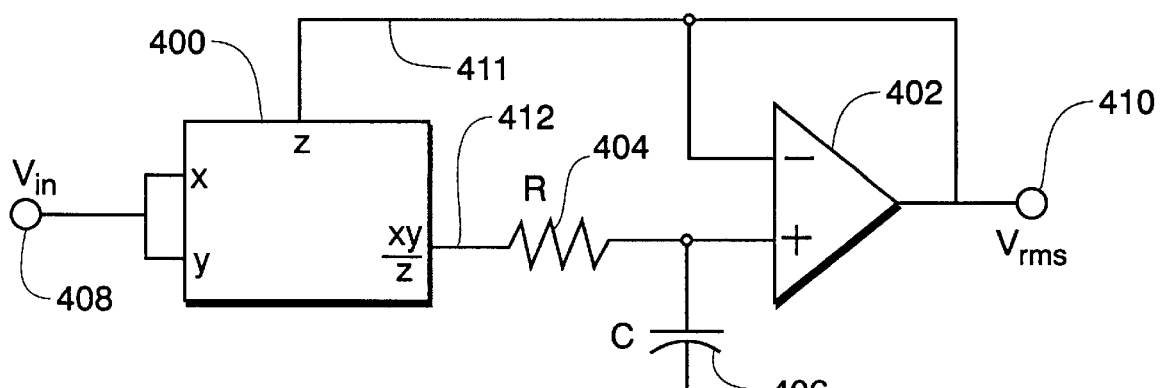
FIG. 4 shows an analog root-mean-square magnitude computation circuit.
Figure 5:
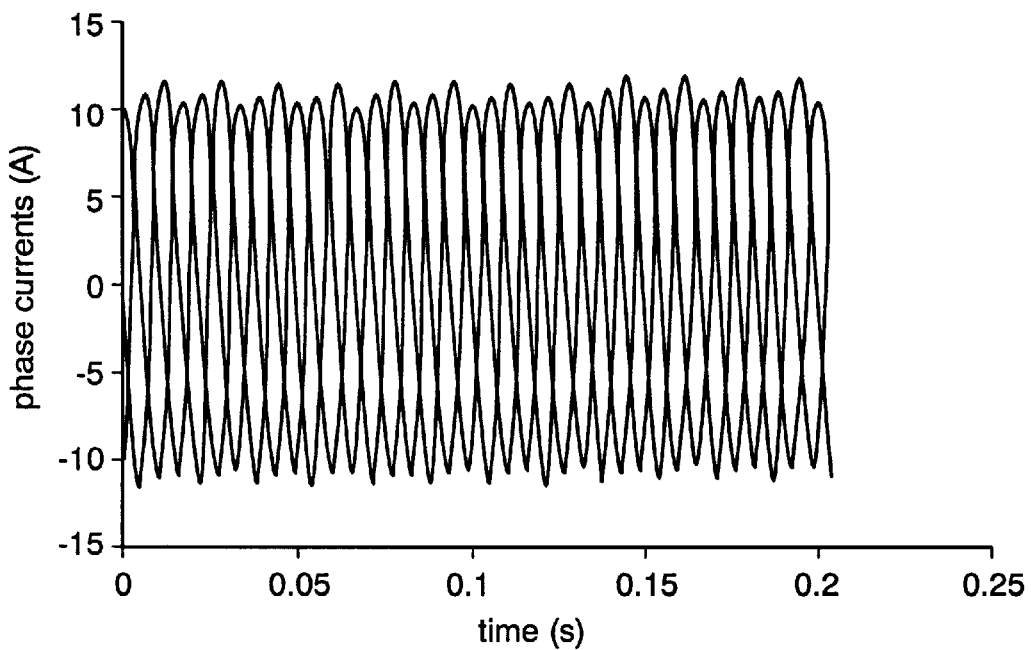
FIG. 5 shows phase currents in amperes for an experimental motor operated at 60Hertz with a bolted single turn fault.

FIG. 4 in the drawings in fact shows an analog circuit embodiment of a root-mean-square computation circuit which may be used at 123 in the FIG. 1 apparatus. In FIG. 4 a conventional analog multiplication circuit 400 is connected to an operational amplifier 402 in a manner causing instantaneous voltage input signals, appearing at node 408, to generate root-mean-square signals at node 410. With the analog multiplication circuit 400 having its x and y input nodes connected in parallel to the input signal of node 408, and the z input node connected to the feedback output signal of path 411, the paralleled inputs perform the squaring operation of a root-mean-square computation while the feedback signal accomplishes the square root operation. The electrical wave filter comprised of resistor 404 and capacitor 406 perform the "mean" function computation of the root-mean-square processing and also selects the time constant of the circuit to accomplish the input signal sampling part of the computation. The FIG. 4 root-mean-square computation circuit may be arranged to compute over a one cycle interval or over some other period with a suitable selection of resistor and capacitor values using time constant relationships known in the art.

The resistor 404 and capacitor 406 may have values such that when multiplied together the product obtained is in the order of one period of the waveform. The analog multiplier circuit 400 may be comprised of a Burr-Brown Corporation type MPY 100 multiplier or similar device and the operational amplifier 402 may be a National Semiconductor type 741 amplifier or reasonable equivalent. Notwithstanding the relative ease with which the FIG. 4 circuitry accomplishes a root-mean-square computation, it is of course possible to accomplish such computation with a software algorithm, i.e., through use of a computer program resident in the microprocessor 128.

Since polyphase power theory, as embodied into adjustable speed drives or inverters, supports a measurement of only two of three machine line currents, and determination of the third current from these two, a somewhat hardware-simplified alternate arrangement of the invention with respect to FIG. 1 is also possible. In an arrangement of this type, the three current transformers and three signal paths of FIG. 1 are replaced with only two current transformers and additional mathematical computation capability—in hardware or software form, for accomplishing the third current determination is used.

Figure 2:
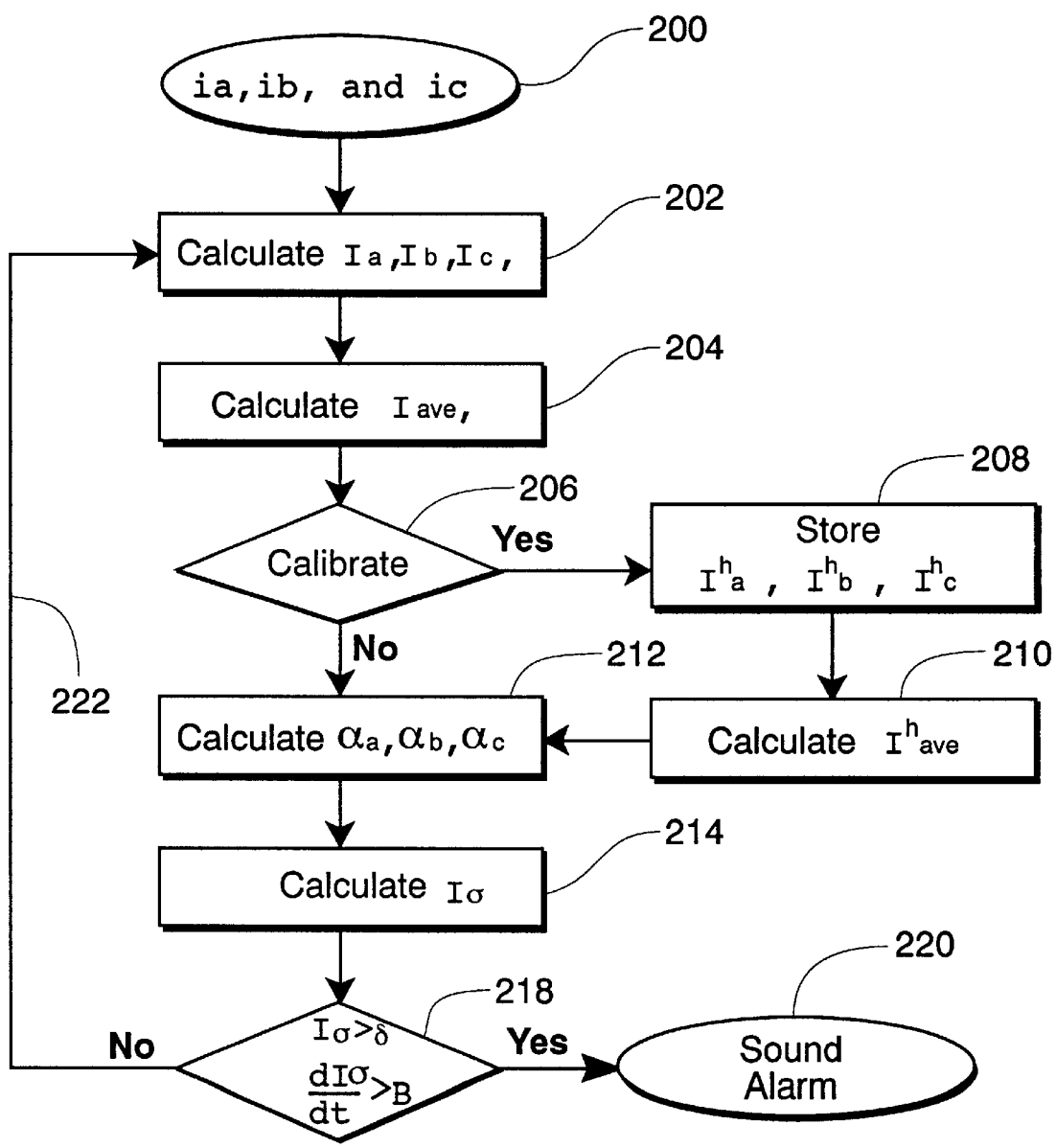
FIG. 2 shows a software flow diagram usable in an embodiment of the invention.

FIG. 2 in the drawings shows a flow diagram usable for accomplishing the computations called for in equations 1–6 above during the repeating iterations of a winding fault monitoring sequence. The FIG. 2 flow diagram is based in part on the order in which intermediate results are needed for subsequent computations of the sequence and therefore is relevant to either a hardware or software embodiment of the computation sequence or to a combined hardware and software embodiment as shown in the FIG. 1 drawing. The FIG. 2 flow diagram may also be used to embody a neural network realization of the invention, an embodiment which may then be "trained" by data obtained during non-faulted and faulted motor operation. In the FIG. 2 drawing the instantaneous signals on paths 122, 124 and 126 are represented at block 200 and the one cycle root-mean-square computation of block 123 in FIG. 1 represented at block 202.

In FIG. 2 the equation (3)-dictated computation of $I_{ave}$ is accomplished in block 204 and the storage of a set of $I_a$, $I_b$ and $I_c$ values as the $I^h_a$, $I^h_b$ and $I^h_c$ determined from instantaneous current values while the motor is deemed to be operating in a healthy, non-shorted turn operating condition is accomplished in block 208. The decision represented in block 206 of FIG. 2 determines if a present iteration through the FIG. 2 sequence is the first to occur or if an upgrading, accomplishing re determination of $I^h$ and $I^h_{ave}$ values, is otherwise needed. By way of this decision at block 206, the storage of $I^h$ values in block 208 and the calculation of $I^h_{ave}$ values in block 210 is accomplished once and need not be immediately repeated during stable motor operating conditions. During these non-repetition of the steps represented by blocks 208 and 210 iterations, repeated use of a stored value set is accomplished. Omission of the block 208 and 210 steps also reduces computer processing time in a software-included or other serially organized embodiment of the FIG. 1 system.

The block 208 determination of healthy value machine currents may be accomplished under conditions of full machine load, no-load or some intermediate value of load. This is possible because of calibration constants accounting for the different conditions. Use of full load during this determination is possibly most desirable, however, so long as the machine is free of saturation, the calibration constant concept permits a determination under any load condition to be used.

Determination of values for the three current scaling factors $\alpha_a$, $\alpha_b$ and $\alpha_c$ dictated in the above recited equation (2) and equation (5) occurs in block 212 of the FIG. 2 sequence. Use of these scaling factors to determine the squared current difference quantities of the standard deviation or variance measures, as typically called for in equation (6), is represented in block 214 of FIG. 2. Comparison of the standard deviation or variance measures and rates of change with a threshold value, $\sigma$, of selected amplitude, $\beta$, is accomplished in block 218 of the FIG. 2 sequence and the alarm issuance resulting from a standard deviation or variance in excess of this threshold indicated at block 220. If the computed standard deviation or variance is smaller than the threshold value, a repetition of the FIG. 2 sequence—that is a second iteration of the FIG. 2 steps—is accomplished by way of the path 222 in FIG. 2. The path 222 may also be coupled to the alarm function of block 220 in order that an alarm condition not halt execution of FIG. 2 steps but allow their ongoing repetition—as a verification of a once detected winding fault condition or in order to respond to a cooling of the motor and decreased leakage current, for examples.

It is recognized that useful information regarding the ensuing failure of winding insulation in an electrical machine may additionally be gained from the rate of change of leakage current flowing through the machine's insulation. Clearly, for example, an onset of significant leakage which occurs within a period of a few minutes is a condition which should be detected early on and possibly prior to production of a value of standard deviation or variance which itself provokes a FIG. 2 alarm condition. In the present invention this rate of change of leakage current, i.e., the winding turn related rate of change of machine balance, is evaluated in the block 218 of FIG. 2 where the time derivative of the standard deviation or variance quantity computed during a succession of iterations through the FIG. 2 step sequence is evaluated. A comparison of the time derivative of leadage current with a second selected threshold value is additionally accomplished in the block 218 of FIG. 2 and either decision thus represented in FIG. 2 is made capable of enabling the alarm condition of block 220.

Figure 3:
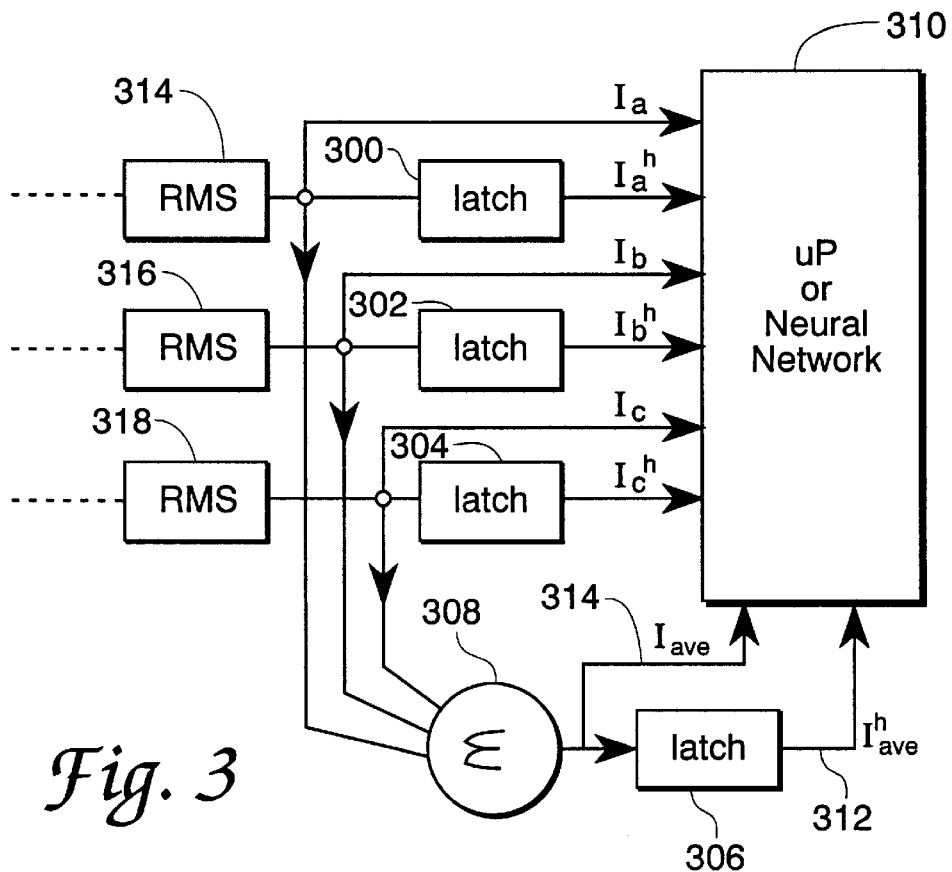
FIG. 3 shows an alternate hardware-inclusive arrangement for a portion of the invention.

An extension of the FIG. 1 concept of using a mixture of hardware and software functions to embody the present invention appears in FIG. 3 of the drawings. In FIG. 3 additional of the functions relegated to the microprocessor 128 in the FIG. 1 system are now embodied as analog circuit elements. In the FIG. 3 drawing the root-mean-square computation circuit (or circuits) represented at 123 in FIG. 1 appear as the individual root-mean-square circuits represented at 314, 316 and 318. Analog latch circuits (for example circuits otherwise known as sample and hold memory circuits) storing healthy machine values $I^h_a$, $I^h_b$ and $I^h_c$ of the computed one cycle root-mean-square current amplitudes are shown at 300, 302 and 304 in FIG. 3. An analog latch circuit storing the summed current values $I_a$, $I_b$ and $I_c$ is shown at 306. Summation of the current values $I_a$, $I_b$ and $I_c$ prior to this storage in the block 306 analog latch is accomplished in the analog summation or addition circuit shown at 308 in the FIG. 3 drawing. Signals representing $I^h_{ave}$ and $I_{ave}$, the average of summed $I_a$, $I_b$ and $I_c$ values and $I^h_a$, $I^h_b$ and $I^h_c$, values, are communicated to the FIG. 3 microprocessor 310 along the paths 314 and 312 of FIG. 3.

Experimental Results

The present invention current-based method of turn fault detection has been tested under two conditions of motor operation. The test machine is a ten horsepower, 230 Volt, 60 Hertz, four pole, 1740 revolutions per minute, wye-connected, floating neutral, squirrel cage rotor, induction motor of the Reliance Electric and Engineering Company (Cleveland, Ohio) cast iron frame type. This test machine has been rewound to provide experimental turn short-enabling winding taps at the 32nd, 33rd, 34th and 35th turns of one 144-turn stator winding. An adjustable speed drive provides balanced excitation to the machine and the driven mechanical load consists of a variably loaded DC machine. Data relating to the first operating condition of this machine is disclosed in FIG. 5 through FIG. 10 of the drawings herein.

Figure 9:
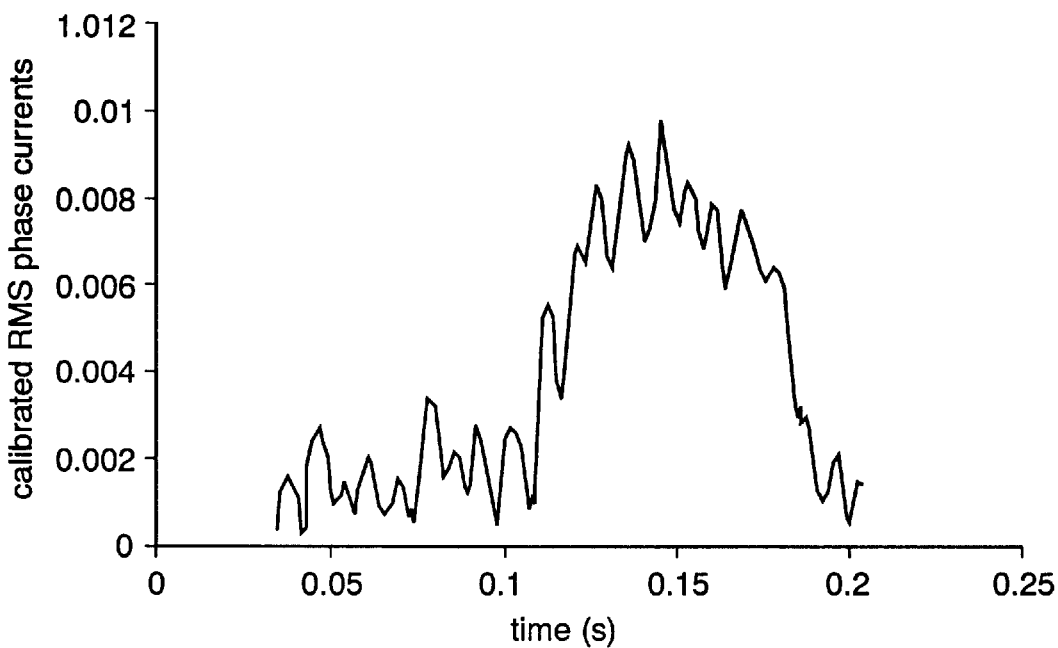
FIG. 9 shows standard deviation of the FIG. 8 currents with respect to an average current.
Figure 10:
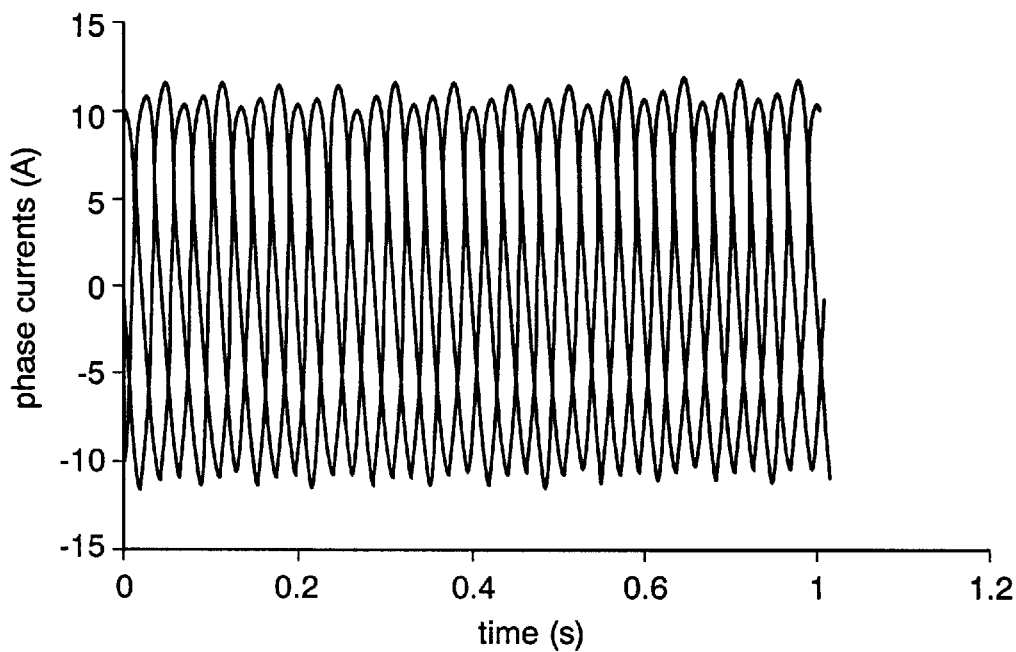
FIG. 10 shows phase currents in amperes for the experimental motor operated at 10Hertz with a bolted three-turn fault.

The first operating condition consists of 60 Hertz excitation by an electronic inverter while the motor is loaded to 1740 rpm (3.3% slip) with about 8 Amperes of current in each phase. The second operating condition differs primarily in frequency and load and involves 10 Hertz adjustable speed drive inverter excitation and load to 200 rpm (33% slip) with about 8.5 Ampere phase currents. Data relating to this second operating condition is disclosed in FIG. 10 through FIG. 14 of the drawings herein. In each operating condition, the machine is faulted during a portion of the window of examination. For the 60 Hertz test, a single phase, single-turn fault is introduced and, as shown in FIG. 9, is found to be readily detectable. In the 10 Hertz test, a single phase three-turn fault provides the ready detectability illustrated in FIG. 14. The achieved levels of sensitivity (compared to background noise) are believed acceptable given the smaller number of turns in the larger machines that are considered to be prime candidates for use of the invention, and in view of the dominant probability of a multi-turn fault in a practical situation.

Figure 6:
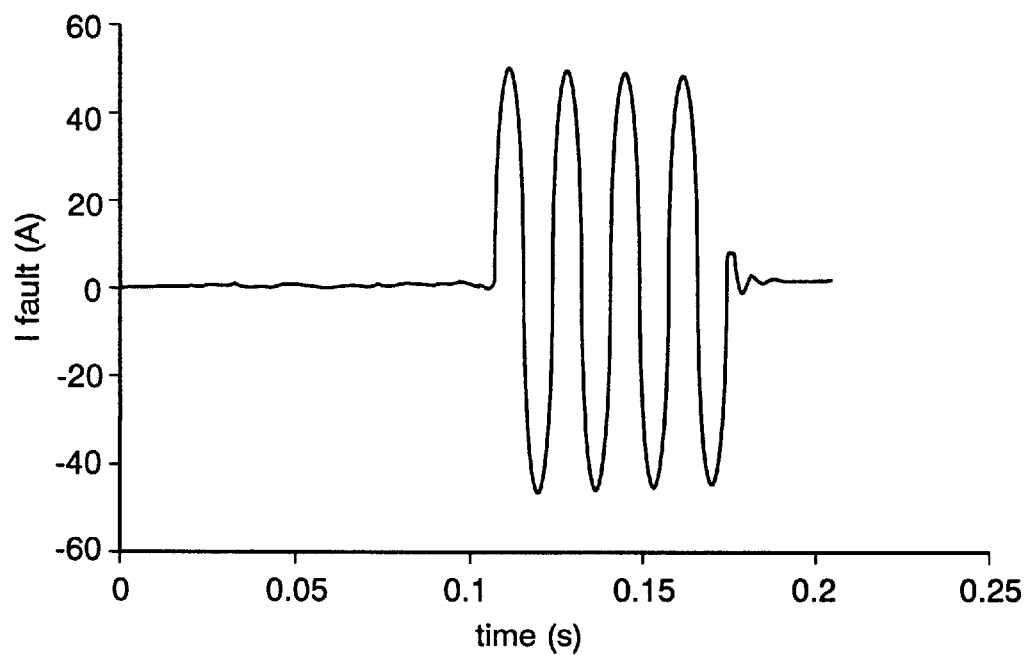
FIG. 6 shows fault current in amperes for the FIG. 5 motor.
Figure 7:
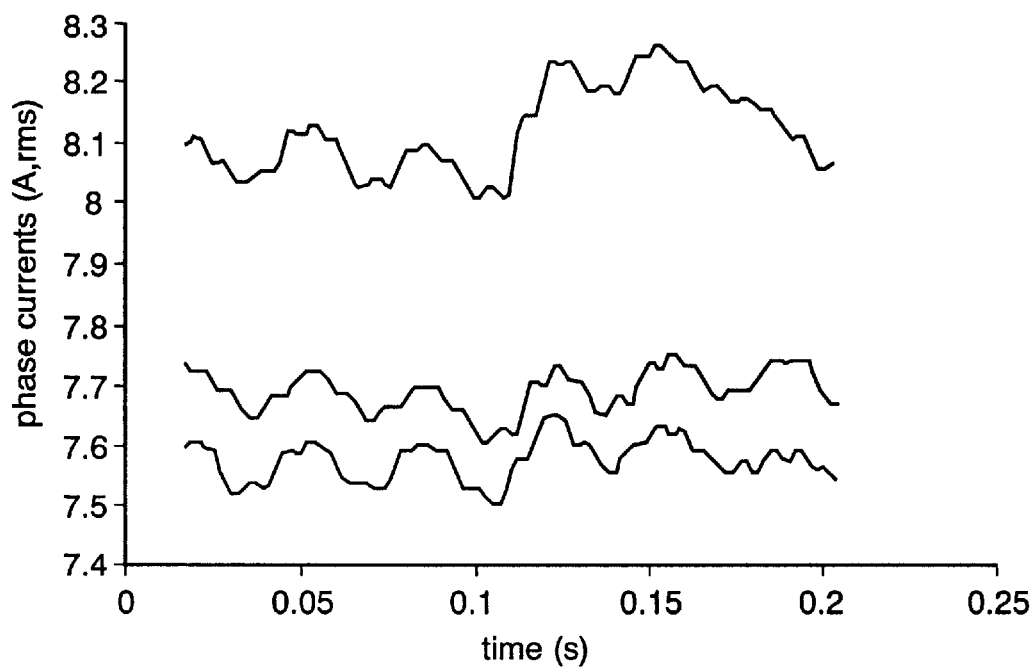
FIG. 7 shows amperes of one-cycle moving-window root-mean-square phase currents for the FIG. 5 motor.
Figure 8:
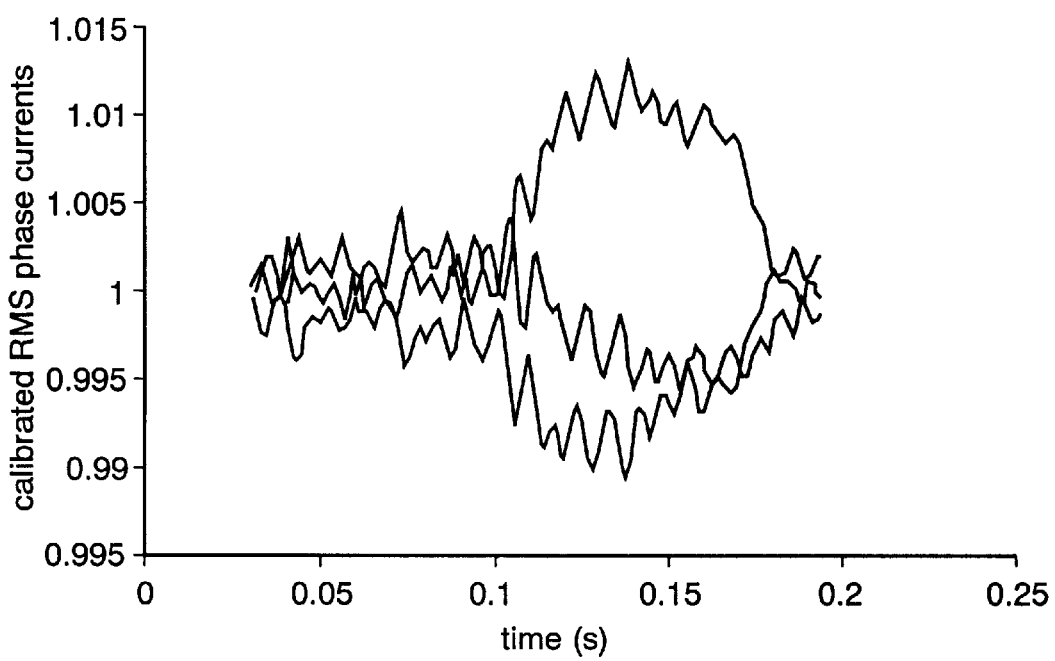
FIG. 8 shows scaled phase currents for the FIG. 5 motor.
Figure 11:
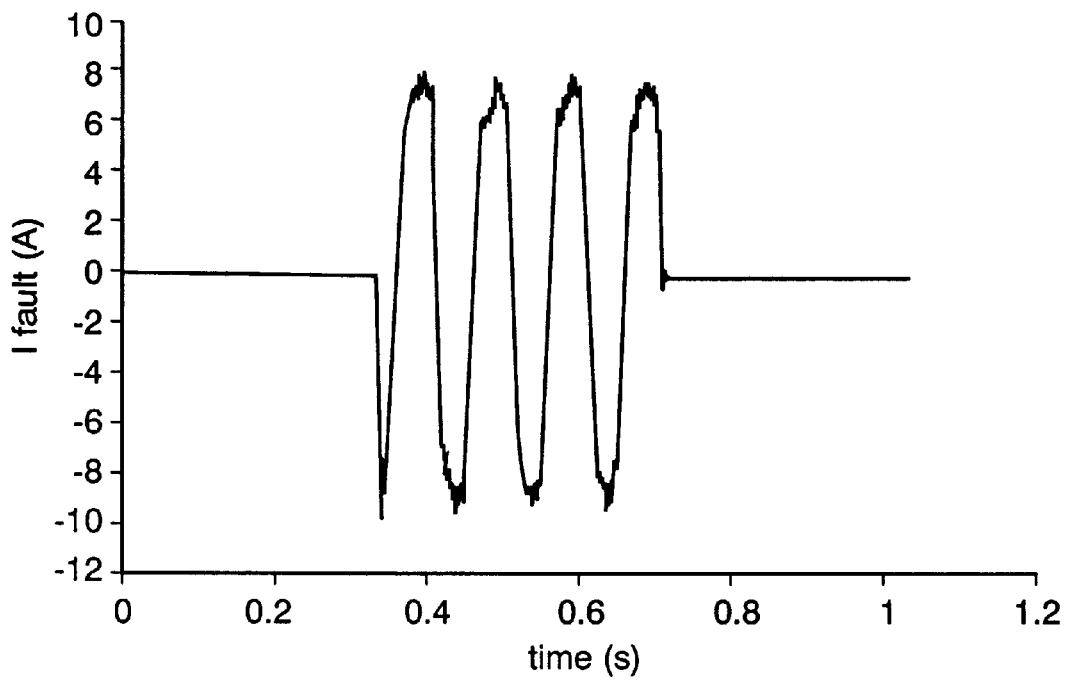
FIG. 11 shows fault current in amperes for the FIG. 10 motor.
Figure 12:
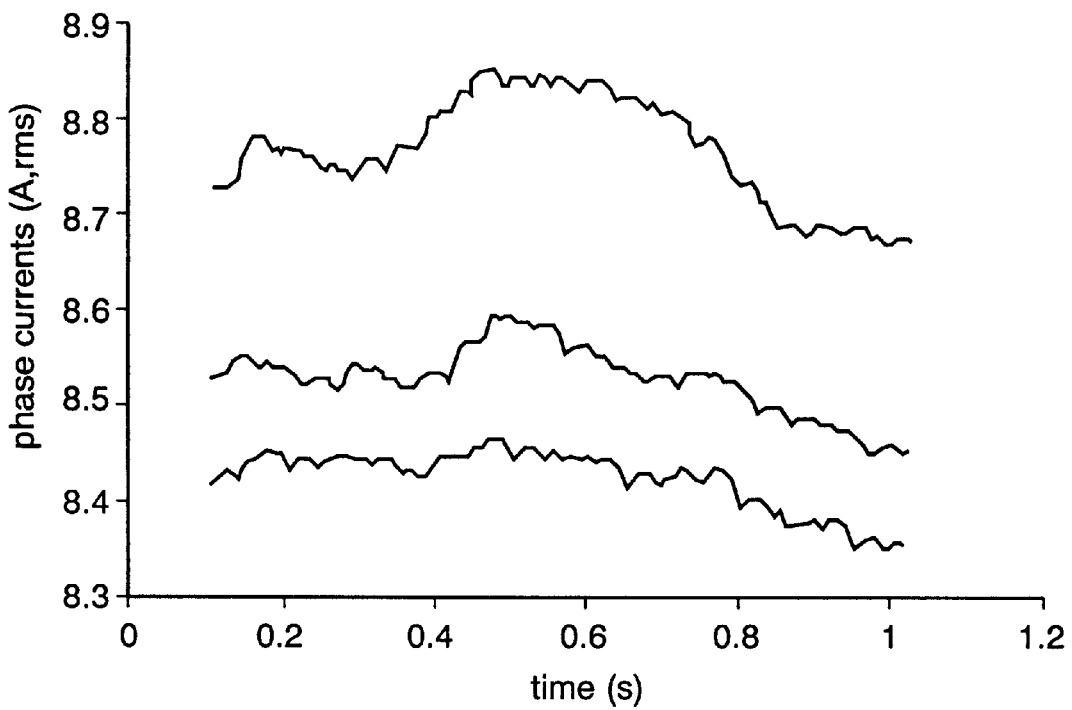
FIG. 12 shows amperes of one cycle moving window root-mean-square phase currents for the FIG. 10 motor.
Figure 13:
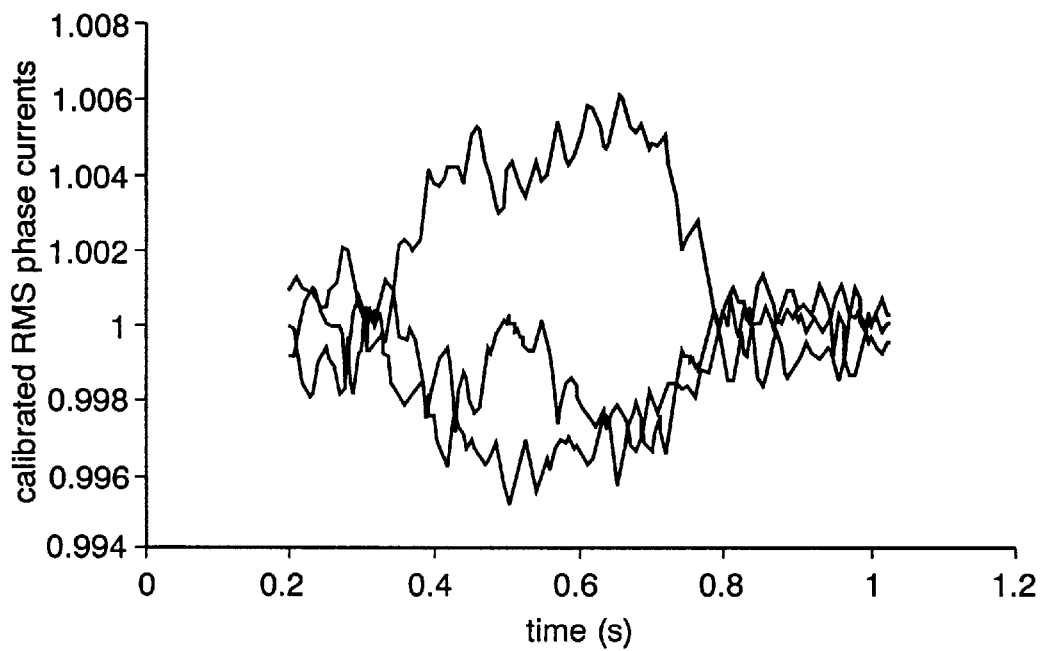
FIG. 13 shows scaled phase currents for the FIG. 10 motor.
Figure 14:
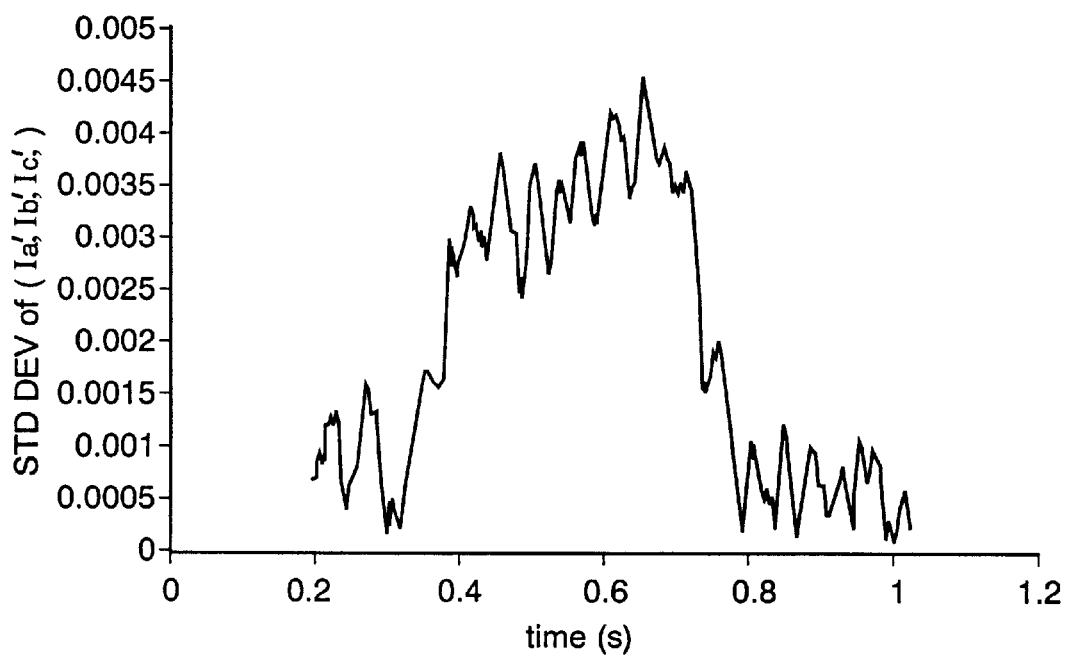
FIG. 14 shows standard deviation of the FIG. 13 currents with respect to an average current.

FIGS. 6 and 11 of the drawings show current flows within the shorted winding turns of one phase of the tested motor under the respective two operating conditions. FIGS. 7 and 12 of the drawings show one-cycle-moving-window root-mean-square currents for the three phases of the motor under the respective operating conditions. Notably some fault-related distinction exists between the three currents in each of these drawings; however, detection of the fault at this stage of signal processing would be difficult in view of normal expected current variations, noise, machine to machine differences and so on. FIGS. 8 and 13 of the drawings show scaled phase currents for the motor under the respective operating conditions; these currents result from signal processing involving equations (2) and (5) above. FIGS. 9 and 14 of the drawings show standard deviation of the respective FIG. 8 and FIG. 13 currents with respect to an average current of 1.0 (as in equation (6) and in FIG. 8 and FIG. 13—this value represents an advantage of the "calibration" process). Notably the data of FIG. 8 and FIG. 13 is not load dependent and therefore the setting of a detection threshold is a straightforward matter.

With respect to sensitivity of the present invention system of fault detection, it is notable that in terms of pure probability, a 5- or 10-turn fault in a machine is as likely to be encountered as a single-turn fault and therefore the achieved sensitivity is abundantly adequate. Two factors influencing this probability are relative placement of turns, i.e., whether the machine is random wound or form wound, and the potential occurrence of larger voltages between turns of a high voltage machine, particularly under random wound conditions. These factors make a multi-turn fault involving more than 5% of the winding turns a potential reality and again demonstrate the achieved sensitivity to be abundantly adequate.

The present invention demonstrates therefore that machine phase currents alone provide sufficient information for a turn fault monitoring scheme. When the invention is embodied in a motor machine, an inverter energy source eliminates the possibility of phase current change in response to uncertainty in the source-voltage balance and minimizes resulting false fault detections by the current monitoring scheme. (When embodied into a generator, this balanced source corresponds to a balanced machine load.) As demonstrated in the invention, comparing root-mean-square currents of a machine reveals change in the machine's internal electrical balance in a manner usable for fault detection. Two mechanisms are found to be responsible for such balance changes: (1) rotor eccentricities which affect each phase equally; and (2) turn faults, the faults to be detected which are likely due to insulation failure. The disclosed phase current based fault detection is relevant regardless of the internal wye or delta connection of the machine.

The invention is herein disclosed by way of discussion and examples involving sixty Hertz and other low frequency inverter excitations of a motor machine. It is of course intended that these examples are selected merely as a convenience, not as limitations of the invention and that the scope of the claims recited below include other uses of the invention. Uses of the invention with 400 Hertz machines, including alternators, as commonly found in aircraft, with fifty Hertz machines as usually found in Europe and other parts of the world and use with machines of two or greater than three phase energy sourcing are but a few examples.

While the apparatus and method herein described constitute a preferred embodiment of the invention, it is to be understood that the invention is not limited to this precise form of apparatus or method and that changes may be made therein without departing from the scope of the invention which is defined in the appended claims.

What is claimed is:

1. The disturbed electrical balance method of detecting occurrence and severity of winding turn faults in a polyphase alternating current rotating electrical machine, said method comprising the steps of:

determining instantaneous current values for each phase of said polyphase electrical machine;

calculating moving root-mean-square phase current values from said measured instantaneous phase current values;

storing winding turn fault-free healthy operation values of said calculated root-mean-square phase currents;

scaling ongoing calculated root-mean-square phase current values according to both said stored winding turn fault-free healthy operation values of said calculated root-mean-square phase currents and according to changes in a mathematical average of said calculated root-mean-square phase currents;

computing a scaled current difference-based measure of fault-caused current divergence of said scaled ongoing calculated root-mean-square current values;

evaluating a time-derivative of said computed scaled current difference-based measure of fault-caused current divergence; and announcing presence of a suspected machine winding fault in response to magnitudes of said computed fault-caused current divergence and said evaluated time derivative values.

2. The method of detecting occurrence and severity of winding turn faults of claim 1 wherein said polyphase electrical machine is an electric motor and further including the step of energizing said electric motor from an electronic inverter balanced source of polyphase electrical energy.

3. The method of detecting occurrence and severity of winding turn faults of claim 1 wherein said polyphase electrical machine is an alternating current generator and further including the step of loading said generator with a balanced polyphase electrical load.

4. The method of detecting occurrence and severity of winding turn faults of claim 1 wherein said polyphase electrical machine is a three-phase machine inclusive of electrical windings connecting in one of a wye and a delta electrical configurations.

5. The method of detecting occurrence and severity of winding turn faults of claim 1 wherein said step of computing a scaled current difference-based measure of fault-caused current divergence includes the steps of:

determining a mathematical difference between each scaled ongoing calculated root-mean-square phase current value and a scaled representation of an average phase current value;

squaring each of said determined mathematical differences; and generating a sum of said squared mathematical differences.

6. The method of detecting occurrence and severity of winding turn faults of claim 1 wherein said moving root-mean-square phase current values comprise one of:

an integral number of cycles of alternating current in time duration; and one cycle of alternating current in time duration.

7. The method of detecting occurrence and severity of winding turn faults of claim 1 wherein said turn fault-free healthy operation current values comprise current values determined under a selected one of conditions of:

no machine load;

full machine load; and intermediate machine load.

8. The method of detecting occurrence and severity of winding turn faults of claim 1 wherein said step of scaling ongoing calculated root-mean-square phase current values includes scaling according to a mathematical scaling factor of form:

$$\alpha_a = \frac{(I_a^h + I_b^h + I_c^h)}{I_a^h \cdot (I_a + I_b + I_c)},$$

wherein $I_a$, $I_b$ and $I_c$ represent moving-root-mean-square machine phase currents and $I^h_a$, $I^h_b$ and $I^h_c$ represent healthy operation moving-root-mean-square machine phase currents.

9. The method of detecting occurrence and severity of winding turn faults of claim 1 wherein said step of scaling ongoing calculated root-mean-square phase current values includes:

storing a healthy machine, normal operation, winding turn fault-free, root-mean-square current value for each phase of said machine; and determining an average value of said stored healthy machine phase current values.

10. The method of detecting occurrence and severity of winding turn faults of claim 1 further including performing selected of said determining, calculating, storing, scaling, computing, evaluating and announcing steps in repeating iteration in an ongoing cycle of machine monitoring.

11. The method of detecting occurrence and severity of winding turn faults of claim 1 further including performing said determining, calculating, scaling, computing, evaluating and announcing steps in a shortened and repeating iteration cycle following an initial iteration cycle inclusive of said storing step.

12. The method of detecting occurrence and severity of winding turn faults of claim 1 wherein said step of announcing presence of a suspected machine winding fault includes comparing said computed fault-caused current divergence and said evaluated time derivative values with a threshold value that is independent of machine currents.

13. The method of detecting occurrence and severity of winding turn faults of claim 1 wherein said step of determining instantaneous current values for each phase of said polyphase electrical machine includes computing a current value for one phase of a three-phase machine from measured current values in two other phases of said machine.

14. The winding fault detecting method of operating a phase current-monitored polyphase alternating current rotating machine comprising the steps of:

scaling monitored ongoing root-mean-square phase current values of said machine to both winding turn fault-free healthy operation values of said phase currents and to changes in a mathematical average of said monitored phase currents;

determining one of a statistical standard deviation and a statistical variance representations of summed differences between scaled phase current values and scaled mathematical average phase current values in said machine; and indicating a winding fault detection event in response to one of said statistical representations exceeding a selected magnitude.

15. The winding fault detecting method of claim 14 wherein said machine is an electrical motor and wherein said monitored phase currents are ongoing root-mean-square current values determined over intervals of one alternating current cycle of said motor.

16. The winding fault detecting method of claim 14 further including the step of determining said ongoing root-mean-square current values from a plurality of measured instantaneous motor phase currents.

17. The winding fault detecting method of claim 14 wherein said step of scaling monitored ongoing root-mean-square phase current values of said machine includes:

determining a winding turn fault-free root-mean-square healthy operation value of each said phase current;

determining an average of said winding turn fault-free root-mean-square healthy operation current values;

determining a monitored interval root-mean-square value of each said phase current;

determining an average of said monitored interval root-mean-square phase current values; and forming a mathematical quotient from said average of winding turn fault-free root-mean-square healthy operation current values and said average of monitored interval root-mean-square phase current values.

18. The winding fault detecting method of claim 14 further including the steps of:

evaluating a time-derivative of a selected one of said statistical standard deviation and said statistical variance representations of summed differences;

comparing said time derivative magnitude with a selected winding fault current rate of change-determined threshold value; and indicating a winding fault detection event in response to said time derivative magnitude exceeding said threshold value.

19. The phase current based alternating current machine winding fault detection method comprising the steps of:

comparing time segregated values of corresponding phase currents in said machine to determine changes in machine electrical current balance;

said comparing step including compensating for load change-induced average phase current changes in said machine;

said comparing step additionally including determination of a statistical difference measurement between said time segregated values of corresponding phase currents; and communicating a determination of suspected machine winding fault in response to detection of a selected degree of machine electrical current balance change.

20. Winding turn fault-protected polyphase alternating current rotating electrical machine apparatus comprising the combination of:

a polyphase alternating current electrical machine connected with a balanced polyphase source of electrical energy;

means for determining instantaneous current values for each phase of said polyphase electrical machine;

means for calculating moving root-mean-square phase current values from said measured instantaneous phase current values;

means for storing winding turn fault-free healthy operation values of said calculated root-mean-square phase currents;

means for scaling ongoing calculated root-mean-square phase current values according to both said stored winding turn fault-free healthy operation values of said calculated root-mean-square phase currents and according to changes in a mathematical average of said calculated root-mean-square phase currents;

means for computing a scaled current difference-based measure of fault-caused current divergence in said scaled ongoing calculation of root-mean-square current values;

means for evaluating a time-derivative of said computed scaled current difference-based measure of fault-caused current divergence; and means for announcing presence of a suspected machine winding fault in response to magnitudes of said computed fault-caused current divergence and said evaluated time derivative values.

21. Winding fault-monitored polyphase AC induction motor apparatus comprising the combination of:

a source of balanced polyphase alternating current electrical energy;

a polyphase induction motor having electrical windings energized by said balanced polyphase alternating current electrical energy source;

a plurality of instantaneous electrical current flow-measuring elements disposed intermediate said source of balanced polyphase alternating current electrical energy and individual phases of said motor electrical windings;

first electrical current signal processing apparatus connected with said instantaneous electrical current flow-measuring elements and generating moving one cycle root-mean-square phase current signal values from a plurality of said instantaneous electrical current flow-measurements;

second electrical current signal processing apparatus connected with said first electrical current signal processing apparatus moving one cycle root-mean-square current signal values and scaling ongoing generated root-mean-square phase current values according to both stored winding turn fault-free healthy operation values of said one cycle root-mean-square phase currents and according to changes in a mathematical average of said root-mean-square phase current signal values;

third electrical current signal processing apparatus connected with said second electrical current signal processing apparatus and generating standard deviation signal values from selected scaled current signal difference values generated therein; and threshold comparison circuitry connected with said third electrical current signal processing apparatus standard deviation signal values and generating a winding fault alarm signal in response to standard deviation signal values in excess of a selected threshold signal value.

22. The winding fault-monitored polyphase AC indication motor apparatus wherein said first, second and third electrical current signal processing apparatus and said threshold comparison circuitry elements comprise one of:

a programmed digital computer, an array of electrical circuit hardware, and a combination of a programmed digital computer and an array of electronic circuit hardware.

23. The method of detecting polyphase alternating current electrical machine winding faults comprising the steps of:

measuring a sequence of winding fault-free healthy operation instantaneous phase current values in said polyphase alternating current electrical machine;

calculating moving root-mean-square phase current values from said measured sequence of instantaneous phase current values;

computing a first average value, an average of said moving root-mean-square phase current values;

storing a first set of said winding turn fault-free healthy operation calculated root-mean-square phase current values, said first set including a stored value for each phase of said machine;

determining a second average value, an average of said stored set of winding turn fault-free healthy operation calculated root-mean-square phase current values;

normalizing subsequent moving root-mean-square phase current values for said machine to a respective one of said first set of said winding turn fault-free healthy operation calculated root-mean-square phase current values to form to a set of per unit phase current values;

scaling each of said per unit phase current values by a ratio of said second average value, of said stored set of winding turn fault-free healthy operation calculated root-mean-square phase current values, to said first average value, of said moving root-mean-square phase current values, to form a plurality of normalized scaled per unit phase current values; and indicating a winding fault detection event in response to a statistical evaluation of said plurality of normalized scaled per unit phase current values exceeding a selected threshold value.

24. The method of detecting polyphase alternating current electrical machine winding faults of claim 23 wherein said statistical evaluation of said plurality of normalized scaled per unit phase current values comprises application of a selected one of a standard deviation and a variance statistical evaluations.

25. The method of detecting polyphase alternating current electrical machine winding faults of claim 24 wherein said step of indicating a winding fault detection event is also responsive to time rate of change of said selected standard deviation and variance statistical evaluations.

* * * * *